(12) United States Patent
Marquardt et al.

(10) Patent No.: US 11,020,917 B2
(45) Date of Patent: Jun. 1, 2021

(54) SILICONE OPTICS

(71) Applicant: ABL IP Holding LLC, Atlanta, GA (US)

(72) Inventors: Craig Eugene Marquardt, Covington, GA (US); Forrest Starnes McCanless, Oxford, GA (US); Jie Chen, Snellville, GA (US); John Bryan Harvey, Newark, OH (US); Yinan Wu, Dunwoody, GA (US); Daniel Aaron Weiss, Tucker, GA (US)

(73) Assignee: ABL IP Holding LLC, Atlanta, GA (US)

( * ) Notice: Subject to any disclaimer, the term of this patent is extended or adjusted under 35 U.S.C. 154(b) by 308 days.

(21) Appl. No.: 16/142,338

(22) Filed: Sep. 26, 2018

(65) Prior Publication Data

US 2019/0016073 A1 Jan. 17, 2019

Related U.S. Application Data

(62) Division of application No. 14/275,177, filed on May 12, 2014, now Pat. No. 10,807,329.

(Continued)

(51) Int. Cl.
  *B29C 45/00* (2006.01)
  *B29C 48/12* (2019.01)
  (Continued)

(52) U.S. Cl.
  CPC ...... *B29D 11/0073* (2013.01); *B29C 45/0003* (2013.01); *B29C 48/07* (2019.02);
  (Continued)

(58) Field of Classification Search
  CPC . B29C 33/46; B29C 45/0001; B29C 45/0003; B29C 45/14; B29C 45/40;
  (Continued)

(56) References Cited

U.S. PATENT DOCUMENTS 2,860,083 A 11/1958 Nitzsche et al.
4,689,000 A 8/1987 Kouichi et al.
(Continued)

FOREIGN PATENT DOCUMENTS

EP 2484956 8/2012
EP 3081365 10/2016
(Continued)

OTHER PUBLICATIONS

European Application No. EP15199875.4 an Office Action dated Jan. 18, 2019, 6 pages.
(Continued)

*Primary Examiner* — Michael A Tolin
(74) *Attorney, Agent, or Firm* — Kilpatrick Townsend & Stockton LLP

(57) ABSTRACT

Silicone-containing light fixture optics. A method for manufacturing an optical component may include mixing two precursors of silicone, opening a first gate of an optic forming device, moving the silicone mixture from the extrusion machine into the optic forming device, cooling the silicone mixture as it enters the optic forming device, filling a mold within the optic forming device with the silicone mixture, closing the first gate, and heating the silicone mixture in the mold to at least partially cure the silicone. Alternatively, a method for manufacturing an optical component may include depositing a layer of heat cured silicone optical material to an optical structure, arranging one or more at least partially cured silicone optics on the layer of heat cured silicone optical material, and heating the heat cured silicone optical material to permanently adhere the one or more at least partially cured silicone optics to the optical structure.

17 Claims, 17 Drawing Sheets

Related U.S. Application Data

(60) Provisional application No. 61/855,207, filed on May 10, 2013.

(51) Int. Cl.

| | | |
|---|---|---|
| *B29C 48/16* | (2019.01) | |
| *B29C 48/90* | (2019.01) | |
| *B29D 11/00* | (2006.01) | |
| *B29K 83/00* | (2006.01) | |
| *B29L 11/00* | (2006.01) | |
| *B32B 17/10* | (2006.01) | |
| *F21V 5/04* | (2006.01) | |
| *G02B 1/04* | (2006.01) | |
| *B29C 48/07* | (2019.01) | |
| *B29C 48/08* | (2019.01) | |
| *B29C 48/13* | (2019.01) | |
| *B29C 48/157* | (2019.01) | |
| *B29C 48/86* | (2019.01) | |
| *G02B 27/30* | (2006.01) | |
| *B29C 65/48* | (2006.01) | |
| *G02B 1/10* | (2015.01) | |
| *B29C 48/00* | (2019.01) | |
| *B29C 48/88* | (2019.01) | |
| *B29K 283/00* | (2006.01) | |
| *H05K 3/28* | (2006.01) | |
| *B32B 37/12* | (2006.01) | |

(52) U.S. Cl.
CPC .............. *B29C 48/08* (2019.02); *B29C 48/13* (2019.02); *B29C 48/157* (2019.02); *B29C 48/16* (2019.02); *B29C 48/865* (2019.02); *B29C 65/4835* (2013.01); *B29D 11/00298* (2013.01); *B29D 11/00442* (2013.01); *B32B 17/10798* (2013.01); *F21V 5/045* (2013.01); *G02B 1/041* (2013.01); *G02B 1/10* (2013.01); *G02B 27/30* (2013.01); *B29C 48/022* (2019.02); *B29C 48/12* (2019.02); *B29C 48/908* (2019.02); *B29C 48/9135* (2019.02); *B29D 11/00269* (2013.01); *B29K 2083/005* (2013.01); *B29K 2283/005* (2013.01); *B29L 2011/0016* (2013.01); *B32B 2037/1253* (2013.01); *H05K 3/285* (2013.01); *H05K 2201/10106* (2013.01)

(58) Field of Classification Search
CPC ......... B29C 45/43; B29C 45/46; B29C 45/47; B29C 2045/4084; B29C 48/001; B29C 48/022; B29C 48/03; B29C 48/07; B29C 48/12; B29C 48/13; B29C 48/154; B29C 48/155; B29C 48/157; B29C 48/16; B29C 48/22; B29C 48/88; B29C 48/885; B29C 48/90; B29C 48/904; B29C 48/908; B29C 48/911; B29C 48/9135; B29C 48/08; B29C 48/865; B29D 11/00019; B29D 11/00269; B29D 11/00298; B29D 11/00442; B29D 11/0048; B29D 11/0049; B29D 11/005; B29D 11/00663; B29D 11/00721; B29D 11/0073; B29D 11/0074; B29D 11/00807; B29K 2083/00; B29K 2083/005; B29K 2283/005; B29L 2011/00; B29L 2011/0016; B29L 2011/005; B32B 17/10798; B32B 2037/1253; F21V 5/04; F21V 5/045; G02B 1/04; G02B 1/041; G02B 1/045; G02B 3/08; G02B 6/0011; G02B 6/0016; G02B 6/002; G02B 6/0065; G02B 1/10; G02B 27/30; H05K 2201/10106; H05K 3/285

See application file for complete search history.

(56) References Cited

U.S. PATENT DOCUMENTS

| | | | |
|---|---|---|---|
| 4,935,665 A | 6/1990 | Murata | |
| 4,992,312 A | 2/1991 | Frisch | |
| 5,316,703 A | 5/1994 | Schrenk | |
| 5,489,802 A | 2/1996 | Sakamoto et al. | |
| 5,958,176 A | 9/1999 | Isshiki et al. | |
| 6,040,395 A | 3/2000 | Isshiki et al. | |
| 6,235,862 B1 | 5/2001 | Isshiki et al. | |
| 6,252,724 B1 | 6/2001 | Scheer | |
| 6,518,204 B2 | 2/2003 | Yamakawa et al. | |
| 6,835,440 B1 * | 12/2004 | Konishi | ........... B29C 45/00 264/1.24 |
| 6,997,575 B2 | 2/2006 | Sommers | |
| 7,040,779 B2 | 5/2006 | Lamke et al. | |
| 7,259,403 B2 | 8/2007 | Shimizu et al. | |
| 7,273,300 B2 | 9/2007 | Mrakovich | |
| 7,344,902 B2 | 3/2008 | Basin et al. | |
| 7,452,737 B2 | 11/2008 | Basin et al. | |
| 7,496,270 B2 | 2/2009 | Kim et al. | |
| 7,625,986 B2 | 12/2009 | Yoshitake et al. | |
| 7,651,887 B2 | 1/2010 | Morita et al. | |
| 7,651,958 B2 | 1/2010 | Morita et al. | |
| 7,709,853 B2 | 5/2010 | Medendorp, Jr. | |
| 7,763,478 B2 | 7/2010 | Loh et al. | |
| 7,763,697 B2 | 7/2010 | Kato et al. | |
| 7,850,341 B2 | 12/2010 | Mrakovich et al. | |
| 7,858,408 B2 | 12/2010 | Mueller et al. | |
| 7,863,392 B2 | 1/2011 | Nakanishi et al. | |
| 7,915,362 B2 | 3/2011 | Ozai | |
| 7,918,590 B1 | 4/2011 | Li et al. | |
| 7,990,033 B2 | 8/2011 | Nakata et al. | |
| 8,002,435 B2 | 8/2011 | Laporte | |
| 8,071,697 B2 | 12/2011 | Frisch et al. | |
| 8,147,742 B2 | 4/2012 | Chen et al. | |
| 8,217,412 B2 | 7/2012 | Yuan et al. | |
| 8,258,502 B2 | 9/2012 | Yoshitake et al. | |
| 8,262,970 B2 | 9/2012 | Morita et al. | |
| 8,287,150 B2 | 10/2012 | Schaefer et al. | |
| 8,293,548 B2 | 10/2012 | Cheng et al. | |
| 9,470,395 B2 | 10/2016 | Marquardt et al. | |
| 9,553,227 B2 | 1/2017 | Abe et al. | |
| 9,683,710 B2 | 6/2017 | Schinagl | |
| 9,714,754 B2 | 7/2017 | Spinger et al. | |
| 2004/0004122 A1 | 1/2004 | Gelbart | |
| 2004/0041222 A1 | 3/2004 | Loh | |
| 2004/0080835 A1 | 4/2004 | Chinniah et al. | |
| 2004/0227149 A1 | 11/2004 | Ibbetson et al. | |
| 2005/0041307 A1 | 2/2005 | Barone et al. | |
| 2005/0052737 A1 | 3/2005 | Amemiya et al. | |
| 2005/0092517 A1 | 5/2005 | Fan | |
| 2005/0238304 A1 | 10/2005 | Ogura et al. | |
| 2005/0259424 A1 | 11/2005 | Zampini, II et al. | |
| 2006/0105485 A1 | 5/2006 | Basin et al. | |
| 2006/0108594 A1 | 5/2006 | Iwasaki et al. | |
| 2007/0211473 A1 | 9/2007 | Peck | |
| 2007/0269747 A1 | 11/2007 | Bahadur et al. | |
| 2007/0277869 A1 | 12/2007 | Shan et al. | |
| 2008/0030981 A1 | 2/2008 | Mrakovich et al. | |
| 2008/0048200 A1 | 2/2008 | Mueller et al. | |
| 2008/0157114 A1 | 7/2008 | Basin et al. | |
| 2008/0170396 A1 | 7/2008 | Yuan et al. | |
| 2008/0174997 A1 | 7/2008 | Zampini et al. | |
| 2008/0185601 A1 | 8/2008 | Frisch et al. | |
| 2008/0193749 A1 | 8/2008 | Thompson et al. | |
| 2009/0255568 A1 | 4/2009 | Morgan | |
| 2009/0146175 A1 | 6/2009 | Bahadur et al. | |
| 2009/0214856 A1 | 8/2009 | Gomi | |
| 2009/0225543 A1 | 9/2009 | Jacobson et al. | |
| 2010/0022040 A1 | 1/2010 | Konishi et al. | |
| 2010/0033944 A1 | 2/2010 | Ho | |
| 2010/0044893 A1 | 2/2010 | Biel et al. | |

(56) References Cited

U.S. PATENT DOCUMENTS

| | | | |
|---|---|---|---|
| 2010/0092767 A1 | 4/2010 | Naito et al. | |
| 2010/0128474 A1 | 5/2010 | Chen et al. | |
| 2010/0263723 A1 | 10/2010 | Allen et al. | |
| 2010/0273011 A1 | 10/2010 | Zhong et al. | |
| 2011/0007513 A1 | 1/2011 | Zhang et al. | |
| 2011/0057205 A1 | 3/2011 | Mueller et al. | |
| 2011/0126730 A1 | 6/2011 | Berniard et al. | |
| 2011/0157891 A1 | 6/2011 | Davis et al. | |
| 2011/0186129 A1 | 8/2011 | Gombert | |
| 2011/0194281 A1 | 8/2011 | Josefowicz et al. | |
| 2011/0216538 A1 | 9/2011 | Logan et al. | |
| 2011/0227235 A1 | 9/2011 | Yoshitake et al. | |
| 2011/0235338 A1 | 9/2011 | Chen et al. | |
| 2011/0242807 A1 | 10/2011 | Little, Jr. et al. | |
| 2011/0254047 A1 | 10/2011 | Yoshitake et al. | |
| 2011/0280014 A1 | 11/2011 | Householder et al. | |
| 2012/0006090 A1* | 1/2012 | Ryu | B21D 47/04 72/462 |
| 2012/0061716 A1 | 3/2012 | Yu et al. | |
| 2012/0065343 A1 | 3/2012 | Bahadur et al. | |
| 2012/0074450 A1 | 3/2012 | Sakurai et al. | |
| 2012/0112220 A1 | 5/2012 | West et al. | |
| 2012/0120654 A1 | 5/2012 | Kobayashi et al. | |
| 2012/0125436 A1 | 5/2012 | Cummings et al. | |
| 2012/0156480 A1 | 6/2012 | Kondo et al. | |
| 2012/0165451 A1 | 6/2012 | Igarashi et al. | |
| 2012/0182739 A1 | 7/2012 | Leung et al. | |
| 2012/0235180 A1 | 9/2012 | Medendorp, Jr. | |
| 2012/0267650 A1 | 10/2012 | Schubert et al. | |
| 2012/0300452 A1 | 11/2012 | Harbers et al. | |
| 2013/0026922 A1 | 1/2013 | Allen et al. | |
| 2013/0077320 A1 | 3/2013 | Duan et al. | |
| 2013/0083407 A1 | 4/2013 | Axtell et al. | |
| 2013/0134609 A1 | 5/2013 | Yoshitake et al. | |
| 2014/0111984 A1 | 4/2014 | Rodgers et al. | |
| 2014/0182659 A1 | 7/2014 | Davis et al. | |
| 2014/0204592 A1 | 7/2014 | Miyashita et al. | |
| 2014/0268758 A1 | 9/2014 | Morgan et al. | |
| 2014/0268762 A1 | 9/2014 | Raleigh et al. | |
| 2015/0276170 A1 | 10/2015 | Motoyanagi et al. | |
| 2015/0283768 A1 | 10/2015 | Marquardt et al. | |
| 2018/0194089 A1 | 7/2018 | Marquardt et al. | |

FOREIGN PATENT DOCUMENTS

| | | |
|---|---|---|
| JP | 01293334 | 11/1989 |
| JP | 2010110894 | 5/2010 |
| JP | 2011138831 | 7/2011 |
| WO | 1988001360 | 2/1988 |
| WO | 2004054773 | 7/2004 |
| WO | 2007041805 | 4/2007 |
| WO | 2014183113 | 1/2015 |

OTHER PUBLICATIONS

U.S. Appl. No. 14/275,177 a Non-Final Office Action dated Jan. 18, 2019, 20 pages.
Communication Pursuant to Rule 164(2)(b) and Article 94(3) EPC, App. No. EP14730334.1, dated Sep. 25, 2018, 8 pages.
U.S. Appl. No. 14/275,177, "Non-Final Office Action", dated Mar. 27, 2020, 10 pages.
U.S. Appl. No. 15/878,731, "Non-Final Office Action", dated Apr. 2, 2020, 16 pages.
EP14730334.1, "Office Action", dated Feb. 3, 2020, 6 pages.
EP15199875.4, "Office Action", dated Feb. 11, 2020, 3 pages.
U.S. Appl. No. 14/275,177, "Final Office Action," dated Aug. 2, 2019, 19 pages.
U.S. Appl. No. 14/275,177, Notice of Allowance, dated Jul. 9, 2020, 15 pages.
Ganter et al., "UV crosslinking silicone rubbers open up new fields of application", URL:http://www.momentivespecialtychemicals.com/uploadedFiles/Product_Literature/Silicones/Elastomers/GAK.pdf, Feb. 5, 2013, 4 pages.
Invitation to Pay Additional Fees and Partial Search Report for PCT/US2014/037690, dated Sep. 11, 2014, 5 pages.
International Search Report and Written Opinion for PCT/US2014/037690, dated Dec. 11, 2014, 17 pages.
International Preliminary Report on Patentability for PCT/US2014/037690, dated Nov. 19, 2015, 12 pages.
Restriction Requirement for U.S. Appl. No. 14/275,177, dated Jun. 24, 2016, 6 pages.
Response to Restriction Requirement for U.S. Appl. No. 14/275,177, filed Aug. 23, 2016, 2 pages.
Non-Final Office Action for U.S. Appl. No. 14/275,177, dated Sep. 27, 2016, 10 pages.
Office Action for Canadian Application No. CA 2,911,523, dated Nov. 24, 2016, 4 pages.
Extended European Search Report for European Application No. EP15199875.4, dated Dec. 1, 2016, 15 pages.
Amendment and Response to Non-final Office Action for U.S. Appl. No. 14/275,177, filed Jan. 18, 2017, 16 pages (this needs to be added).
Final Office Action for U.S. Appl. No. 14/275,177, dated Mar. 17, 2017, 18 pages.
Amendment with Request for Continued Examination for U.S. Appl. No. 14/275,177, filed Aug. 16, 2017, 31 pages.
Office Action for Canadian Application No. CA 2,911,523, dated Oct. 6, 2017, 3 pages.
Non-Final Office Action for U.S. Appl. No. 14/275,177, dated Nov. 28, 2017, 17 pages.
Office Action for EP 14730334.1, dated Jan. 17, 2018, 4 pages.
Amendment and Response to Non-Final Office Action for U.S. Appl. No. 14/275,177, filed Mar. 27, 2018, 27 Pages.
Notice of Allowance for CA 2,911,523, dated May 18, 2018, 1 page.
Final Office Action for U.S. Appl. No. 14/275,177, dated May 22, 2018, 22 pages.
Amendment with Request for Continued Examination for U.S. Appl. No. 14/275,177, filed Sep. 24, 2018, 21 pages.
U.S. Appl. No. 15/878,731, Final Office Action, dated Oct. 9, 2020, 21 pages.
U.S. Appl. No. 16/271,432, Notice of Allowance, dated Sep. 30, 2020, 12 pages.
Application No. EP14730334.1, Office Action, dated Nov. 10, 2020, 5 pages.

* cited by examiner

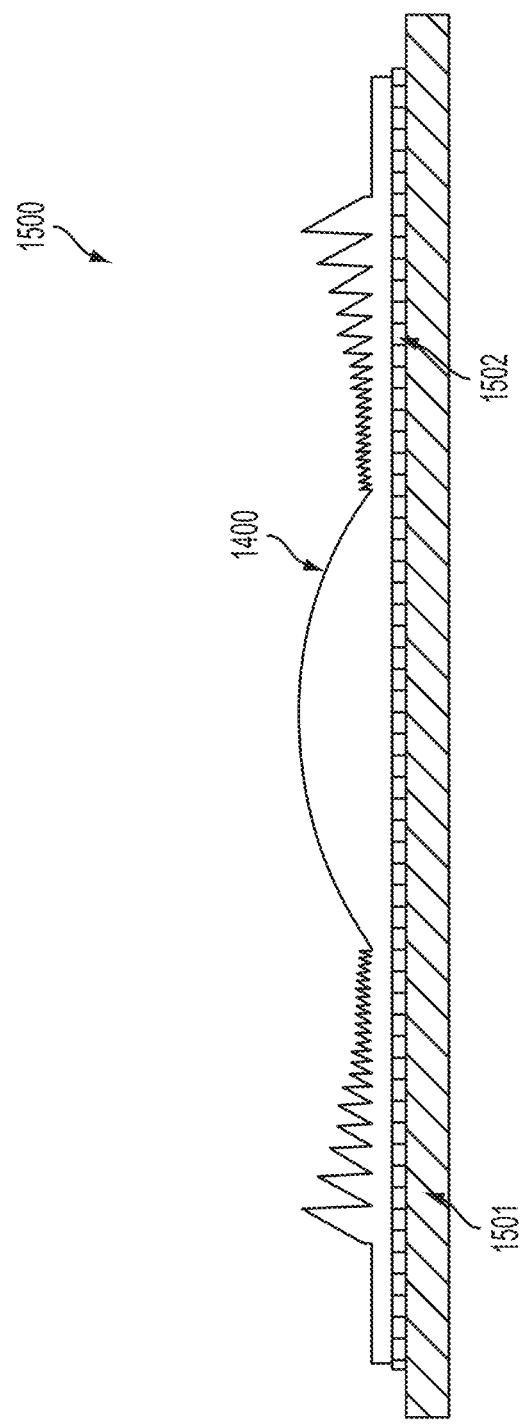

SILICONE OPTICS

CROSS-REFERENCE TO RELATED APPLICATIONS

This application is a divisional patent application of U.S. application Ser. No. 14/275,177, filed May 12, 2014, now U.S. Pat. No. 10,807,329, which claims the benefit of U.S. Provisional Application Ser. No. 61/855,207 filed May 10, 2013, each of which are incorporated by reference.

FIELD OF THE INVENTION

Embodiments of the present invention relate to silicone optics for a light source, such as a light emitting diode (LED) and methods of making same.

BACKGROUND

Electrical lighting and associated light fixtures, or luminaires, are significant sources of energy consumption implicating both environmental and energy cost concerns. Based on estimates by the U.S. Department of Energy (DOE), lighting represents 40% of the electrical consumption in a typical commercial building. U.S. Lighting Energy Policy is moving towards increased efficiency in order to lower greenhouse gas emissions and energy use. Increasing efficiency through maximizing light output while minimizing losses associated with reflecting light in unwanted directions are a focus of the lighting industry. In addition to employing high efficiency light sources, such as light emitting diodes (LED), high efficiency reflectors and lenses are necessary.

There is a need for a long, thin, and optically detailed lens that is nominally 48" to 96" long that is typically used in indoor, industrial, or specialty luminaires. The cost of the tool required to injection mold this size optic lens is extremely high, typically more than $350,000 in 2013. Also the size and weight (typically thousands of pounds) of the tool makes it difficult to handle and to transport the tool from storage to the molding machine. The large size of such a tool limits the type and size of injection molding machines with which such a tool can be used. Only the industry's largest machine can support this size of tool, and part costs increase due to the overhead of running such a large tool and machine, making it difficult to justify this method of optic manufacture for use in an economy class luminaire because the lens cost becomes prohibitive.

It is possible to extrude such lenses (typically formed from a polymeric material such as acrylic), provided they have a uniform profile. However, it is difficult to extrude acrylic poly(methyl methacrylate) (PMMA)/polycarbonate (PC) optical lenses having a flat surface with high polish and with no extruding lines that cause optical striations in the distribution. Moreover, it is also difficult to successfully extrude lenses having thick to thin parts (i.e., some parts of the lens profile are thicker than other parts of the lens profile) because of the inconsistency of polymerization, cross-linking, or curing of such lenses (i.e., the thicker parts take longer to cool and harden) which can lead to unwanted shrinkage, deformation, or distortion of the optical distribution. Furthermore, these problems also reduce the optical efficiency. Extrusion machines have limits on the size and thick to thin ratio that they can handle and extrude properly in order to produce a useable part. Such limitations limit the available optical distributions, and some desired distributions may not be possible. Moreover, limitations inherent in the manufacturing process of glass and plastic lenses render it extremely difficult to incorporate fine detail and small-scale features in the optics.

SUMMARY

In some aspects, a method for manufacturing an optical component can include mixing two precursors or portions of silicone where the two portions may be, for example, (1) a base and a curing agent or (2) an unpolymerized or partially polymerized resin and a crosslinking reagent. The method may also include moving the silicone mixture from the extrusion machine into an optic forming device, cooling the silicone mixture as it enters the optic forming device, extruding the silicone mixture through a die, heating the silicone mixture as it passes through the die to cure the silicone mixture into the optical component, and cutting the optical component at a desired length.

Alternatively, the method can include mixing two portions of silicone (or precursors), opening a first gate at an upstream end of an optic forming device, moving the silicone mixture from the extrusion machine into the optic forming device, cooling the silicone mixture as it enters the optic forming device, filling a mold within the optic forming device with the silicone mixture, closing the first gate, and heating the silicone mixture in the mold to at least partially cure the silicone.

Furthermore, a method is provided that includes applying a layer of heat cured silicone optical material on an optical structure, arranging one or more at least partially cured silicone optics on the layer of heat cured silicone optical material, and heating the heat cured silicone optical material to permanently adhere the one or more at least partially cured silicone optics to the optical structure.

In other aspects, an apparatus for manufacturing an optical component is provided. The apparatus may include an extrusion machine with one or more inputs for supplying at least two portions of silicone (or precursors) to the extrusion machine such that the at least two portions of silicone combine to form a silicone mixture, an optic forming device connected to a downstream output of the extrusion machine such that the optic forming device mounted on a tool platform and configured to receive the silicone mixture from the extrusion machine, a cooling unit attached to the optic forming device adjacent to the interface with the extrusion machine, and a heating unit attached to the optic forming device.

These and other aspects, features and advantages of the present invention may be more clearly understood and appreciated from a review of the following detailed description and by reference to the appended drawings and claims.

BRIEF DESCRIPTION OF THE DRAWINGS

FIG. 15 is a cross-sectional view of an optic assembly.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Embodiments of the present invention provide an optic formed at least partially of moldable silicone. Various types of silicone materials having the properties described herein are available from Dow Corning ("Dow"). Dow's MS-1002 moldable silicone may be useful in certain applications. However, other sources for moldable silicone materials are known or readily identified by those skilled in the art.

Such optics may be formed by a variety of methods or combinations of methods, including extrusion and casting/molding. Embodiments of the methods contemplated herein use an extrusion machine to form the optic. Traditional extruder systems include an extrusion machine that delivers the molten polymeric lens material (e.g., acrylic) to an extruding die and then on to a separate shaping die that imparts the final lens shape. The lens material is exposed to air as it moves between the extruding die and the shaping die, which accelerates cooling and thus curing (particularly the outer surface) of the material between the extruding die and the shaping die. Thus, as the material is fed through the shaping die, the die tends to scrape the hardened outer surface or shell of the partially-formed optic, thereby causing undesirable striations extending along the length of the final optic.

Optical pattern molding may include partially or fully encapsulating a second optical component constructed from a second material such as glass or another optical material (the second optical component may be a printed circuit board or a reflector) within a silicone first optical structure through an injection mold process machine co-molding the parts together to form a single device with multiple optical structure components. The resultant device can include mechanical features or structures for mounting, sealing, or may include textures or patterns to occlude the view through the mechanical structure.

Extruding and Casting Methods

Embodiments of the methods contemplated herein combine an extruding die and shaping die into a single optic forming device having a die or mold therein for forming the optic with the desired geometry. Embodiments of this system are shown in FIGS. 1-4. The optic forming device is also provided with heating/cooling elements to cure the silicone and thereby set it in the desired shape.

Figure 1:
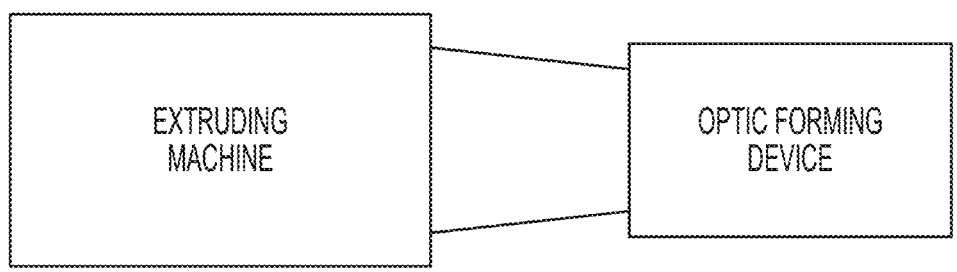
FIG. 1 is a schematic view depicting an apparatus for manufacturing an optical component.
Figure 2:
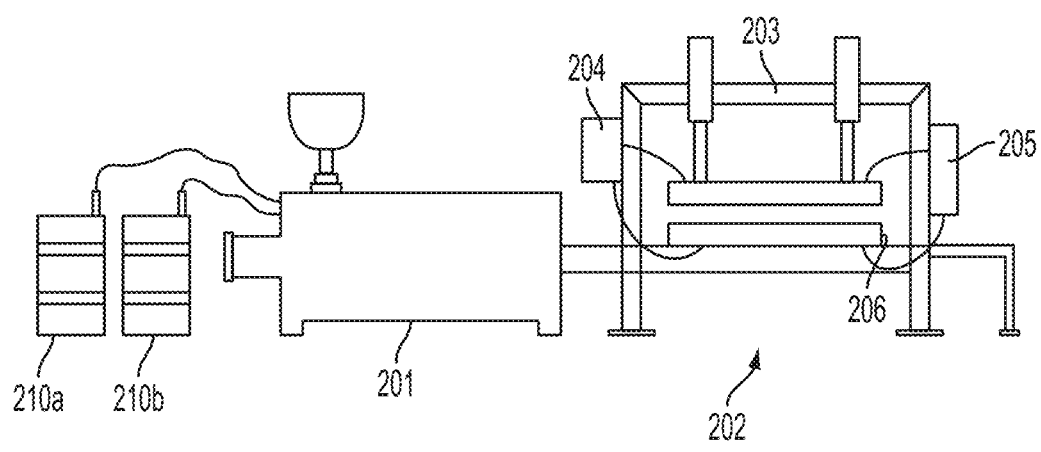
FIG. 2 is a more detailed schematic view depicting the apparatus for manufacturing an optical component of FIG. 1.

As shown in FIG. 2, moldable silicone may be formed from two liquid components combined to form a liquid that is heated to a curing temperature at which the silicone becomes solid. The first part 210a and the second part 210b may be, for example, (1) a base and a curing agent or (2) an unpolymerized or partially polymerized resin and a cross-linking reagent. While the pre-cured viscosity of silicone can vary, in some embodiments, it has a viscosity similar to water. In methods contemplated herein, the first and second parts 210a and 210b are moved from the extrusion machine 201 to the optic forming device 202. The optic forming device may be mounted on a tool platform 203. Very little pressure is required to deliver the silicone into the optic forming device given its low viscosity. Cooling elements 204 proximate the entry point into the optic forming device to ensure that the silicone does not cure too quickly but rather remains in liquid form for extruding and/or casting/molding.

The optic forming device 202 includes an extrusion mechanism to extrude the silicone optic. After the silicone enters the optic forming device, it is extruded through a die 206. Heating elements 205 provide heat to cure the silicone. In this way, a silicone optic can be continuously extruded using the optic forming device 202 and subsequently cut into the desired lengths.

Figure 3:
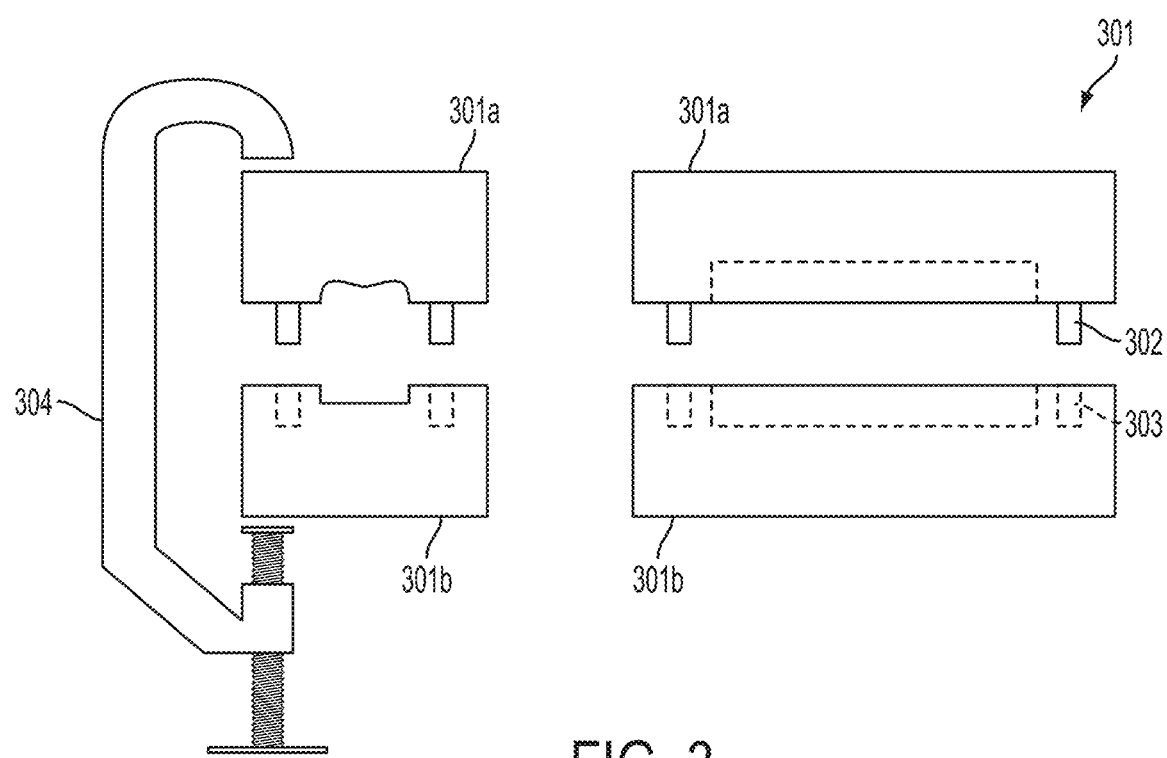
FIG. 3 is a schematic view depicting a separable mold for an apparatus for manufacturing an optical component.

As shown in FIG. 3, in an alternative embodiment, the optic forming device 202 includes a mold 301. The liquid silicone flows into the mold, and, due to its low viscosity, it fills the mold completely leaving no gaps or shrinkage. The mold 301 may include locating pins 302 and corresponding holes 303. The heating elements 205 cure the silicone in the mold 301.

In some embodiments, this casting process is a one shot process where the mold has the precise dimension and geometry of the desired optic. Silicone is injected into the mold through a first gate at an upstream end of the mold and is cured in the mold (e.g., see FIG. 4). The mold is then opened, the optic removed, the mold closed again, and the process repeated so as to form additional, discrete optics. In other embodiments, as depicted in FIG. 3, the mold is formed by a first half mold 301a and a second half mold 301b, at least one of which is moveable relative to the other such that the two halves can be held together by a clamp 304. After the silicone optic is cured in the mold, the two half molds are separated to open the mold 301 and allow the molded part to be removed. The mold 301 is then closed again and the process repeated. This process can permit over-molding silicone onto other existing or previously formed components (including pre-molded or cast materials) such as glass, metals, plastics, printed circuit boards, materials with optical properties such as a reflector, or a mechanical fastener device to mount the optic in a luminaire, as discussed in more detail below. This process may also be used to over mold several times to build up the desired optical distribution or properties. Moreover, it is also possible using this method to form features (e.g., ribs, etc.) on the optic that are discretely located on the optic (i.e., not continuous) or that do not extend parallel to the extrusion direction and thus are not able to be formed using the extrusion process discussed above. Such features may be desirable (but not required) to control the distribution of light parallel to the length of the optic.

The curing process may be limited to a maximum curing temperature. In particular, when a silicone optic is co-molded with a second component that is temperature-sensitive. For example, when co-molding a silicone part with a silicone optic with a circuit board with soldered connections, a maximum curing temperature of 105° C. may be established.

Figure 4:
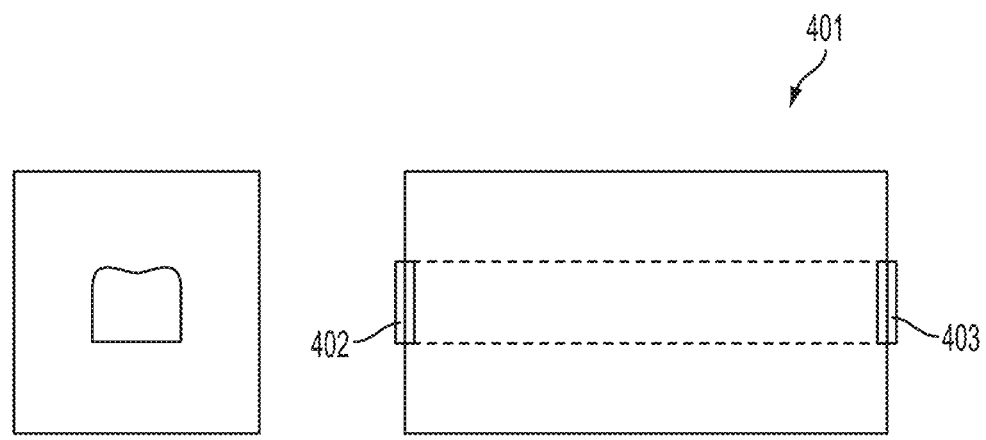
FIG. 4 is a schematic view depicting a non-separable mold for an apparatus for manufacturing an optical component.

In an alternative embodiment, the optic forming device 202 includes a mold 401 that can produce a continuous optic that includes multiple adjacent segments which are formed sequentially. As shown in FIG. 4, after an optic is at least partially cured in a mold 401, it may be moved longitudinally from the mold 401 so as to allow additional silicone material to fill the mold through the first gate 402 behind it for a repeated process. For example, a second gate 403 may be provided at the downstream end of the mold. After the optic is formed, the second gate 403 may be temporarily opened to permit at least a portion of the molded optic to move from the mold, after which, if necessary or desirable, the second gate 403 may be closed again (or partially closed) and the process repeated. The molded optic can be moved from the mold using a variety of methods, including fluid pressure. Fluid may be injected adjacent to the first gate 402 to move the at least partially cured optic toward the second gate 403. The fluid used to move the optic through the mold may be a liquid or a gas including, for example, water, air, argon gas, carbon dioxide, or any inert gas. The optic can be formed having any practical length and subsequently cut to length or separated as needed to produce a part, for example, 24", 48", or 96" long.

Using fluid to propel the optic is advantageous compared to other methods known to the art such as ejector pins. Ejector pins typically leave large witness lines and create images on the surface along the optic, often in several locations, which is not desirable for optical performance. When using pressurized fluid, the fluid can be expelled from one location along the optic (unlike several ejector pins known to the art) such that the fluid creates a ripple effect along the optical surface where the fluid moves and or removes the optic from the mold. The ripple effect is caused by injecting fluid at one end of the tool at the surface of the optical finish where the silicone contacts the mold. This forceful injection of fluid through pneumatics or hydraulics compresses the silicone part in the mold, creating a small bubble at the interface between the surface of the mold and the silicone optic part that propagates along the part to the opposite end of the tool, causing the part to break free from the mold and begin moving to facilitate a transition to another stage of the process for additional over molding, continuous molding, or removal of the part all together from the mold.

The silicone is heat cured and initially forms a shell at the optic surface. Because silicone has no significant expansion/contraction differential, curing of the inner part of the optic after the outer part is cured does not distort the outer shell. Thus, it is possible to mold very complex and detailed optics with high thick to thin ratios using silicone. It is also possible to remove the silicone optic from the optic forming device before it is completely cured to increase production efficiency. Rather, the silicone can be sufficiently cured in the optic forming device to be self-supporting and then removed from the optic forming device. The partially-cured optic can be set aside or further heated to realize full cure without distorting the shape of the optic.

Embodiments of optics contemplated herein can include linear optics or round or otherwise discrete optics. Such optics may be formed by the processes described above or by other processes known in the art.

A continuous linear optic may be formed entirely of silicone. The optic may be formed of any length. In some embodiments, the optic is slim in width compared to its length. In some embodiments, the optic length is between 24" and 96" long, inclusive.

Figure 5:
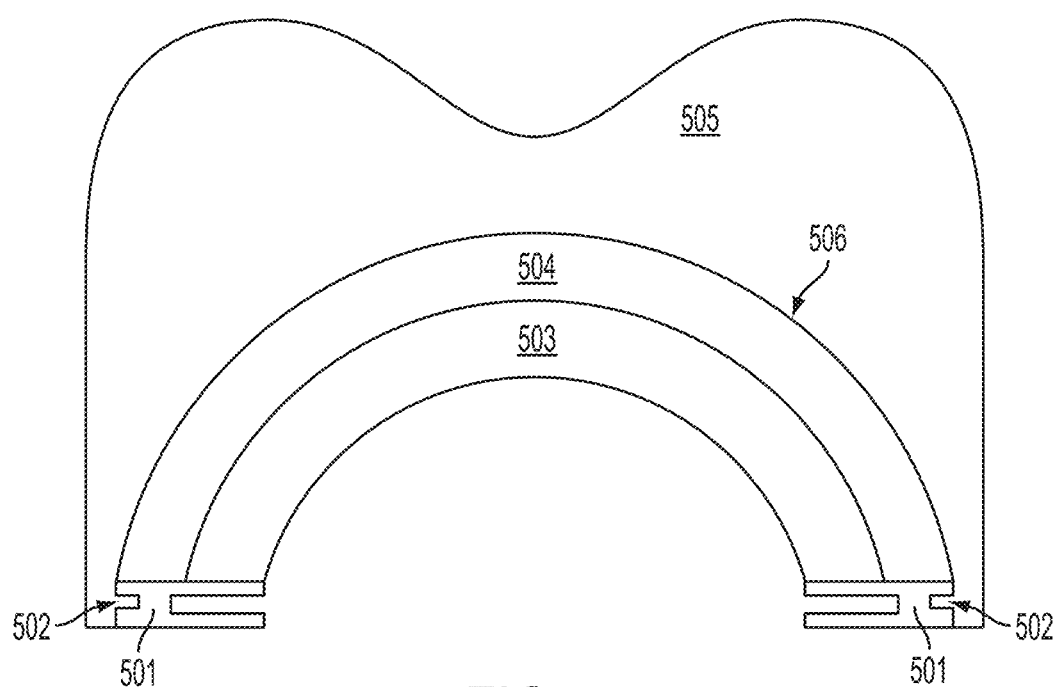
FIG. 5 depicts a multiple-component optic.

A silicone optic may also be extruded or cast/molded onto an existing or previously formed component (including pre-molded or cast materials) such as glass, metals, plastics, printed circuit boards, materials with optical properties such as a reflector, or a mechanical fastener device to mount the optic in a luminaire. For example, FIG. 5 illustrates an optic formed by co-extruding two brackets 501, a first previously formed component 503, and a second previously formed component 504. A similar arrangement could be created in a mold. The first previously formed component 503 may be, for example, a phosphor lens and the second previously formed component 504 may be, for example, a diffuser lens. A silicone optic 505 is subsequently extruded or molded over the existing optic. While not required, the illustrated silicone optic 505 may not be of consistent thickness but rather may have a high thick to thin ratio so as to better shape and control the light emitted from the optic. The optic may be designed to emit light in a single direction or in multiple directions.

Moldable silicone typically does exhibit room temperature vulcanizing (RTV), meaning that by its nature it does not tend to stick or otherwise attach easily to other materials. Rather, mechanical retention may be necessary to attach some embodiments of the silicone optics disclosed herein to other structures. For example, structures or mechanical features such as voids (e.g., grooves, holes, etc.) may be provided in an existing structure over which the silicone is molded so that the silicone fills the voids and, when cured, is mechanically interlocked with the existing structure. FIG. 5 illustrates an embodiment in which grooves 502 are provided on one or both of the mounting brackets for this purpose and the silicone fills the grooves to interlock the silicone optic with the existing optic. Components with multiple layers of differing materials as shown in FIG. 5, may be constructed on a rotary tool.

Figure 6:
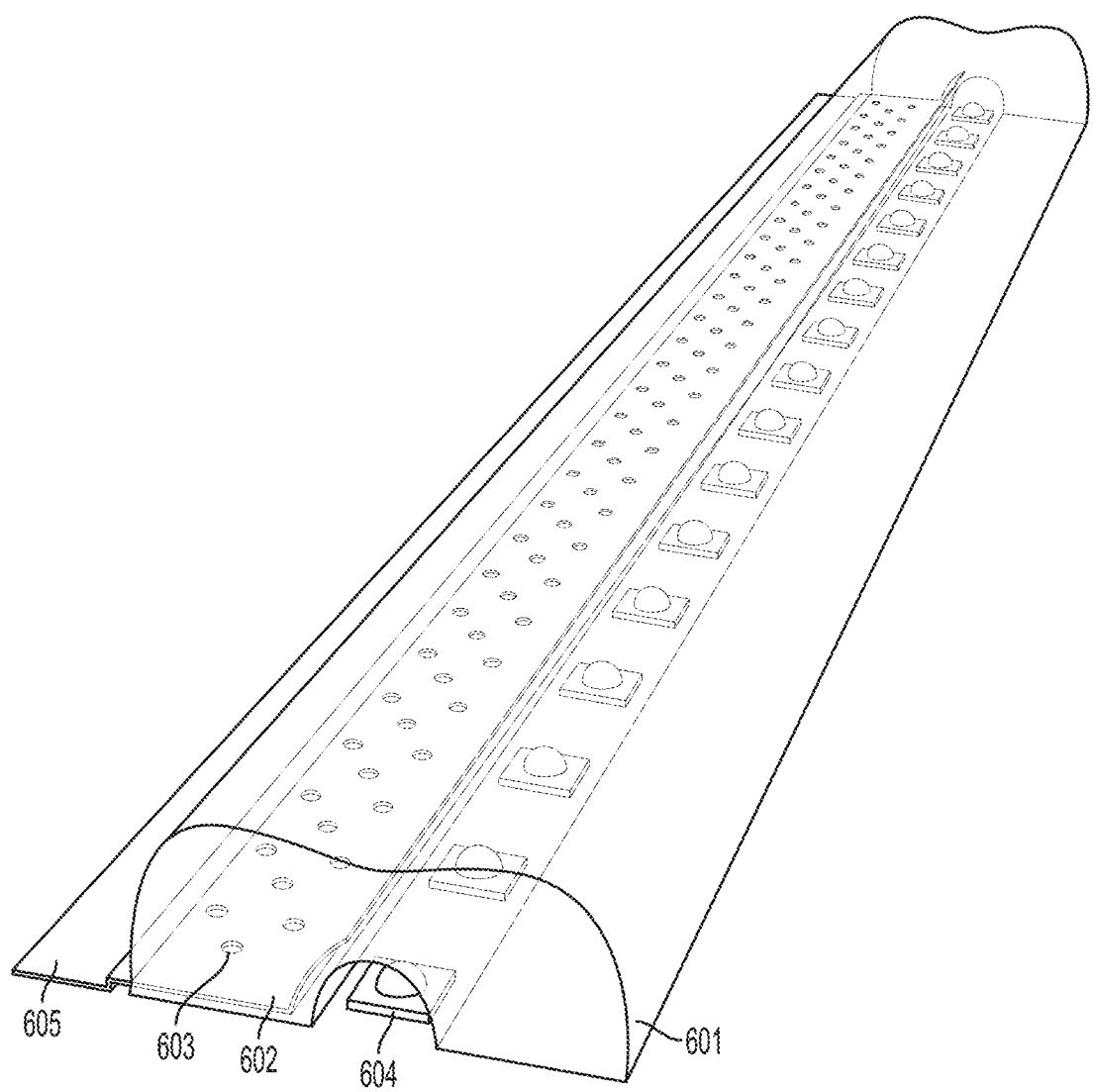
FIG. 6 is a perspective view of an optic formed with a second element at least partially encapsulated therein.
Figure 7:
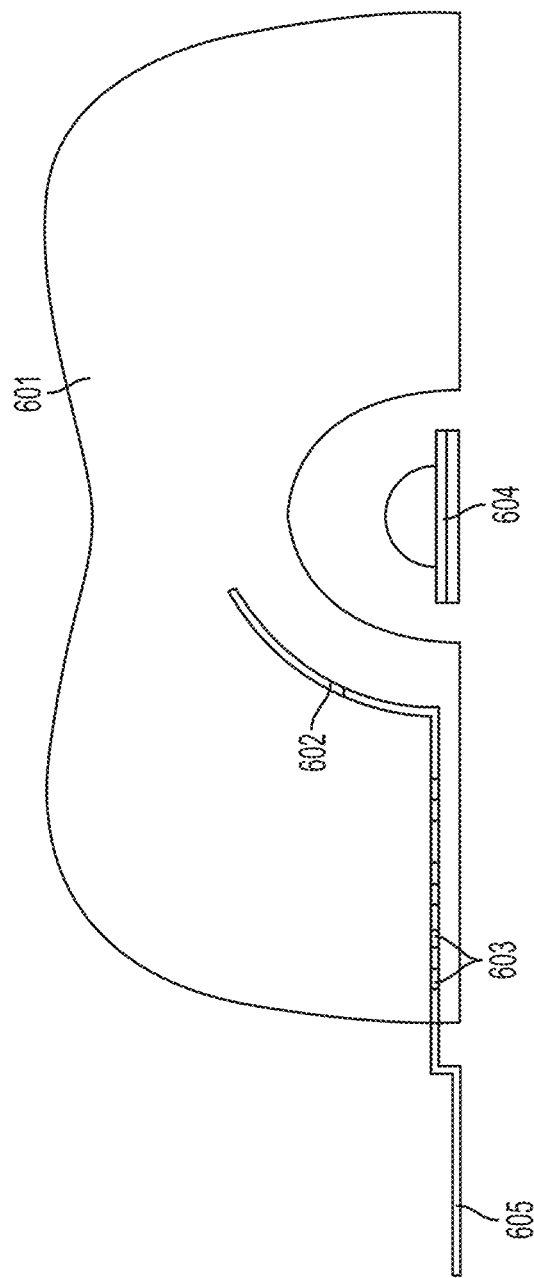
FIG. 7 is a cross-sectional view of the optic of FIG. 6.

In an alternative embodiment, the optic 601 is formed with a reflector 602 or other element at least partially encapsulated within it, as shown in FIGS. 6-9. For example, a reflector 602 may be positioned in a mold and the silicone material cast or molded to form the desired optic 601 and so as to partially or entirely encapsulate the reflector 602. In the embodiment of FIG. 6, apertures 603 extend through a portion of the reflector body. When the silicone is cast around the reflector 602, it fills such apertures 603 so that, when cured, the silicone optic 601 is mechanically interlocked to the reflector body. As shown in FIGS. 6-9, the optic 601 may be extruded or cast/molded to include one or more recessed areas to at least partially surround an adjacent component. For example, the optics shown in FIGS. 6-9 include a recessed area located near an adjacent component 604 where the adjacent component 604 may be one or more light sources.

Figure 8:
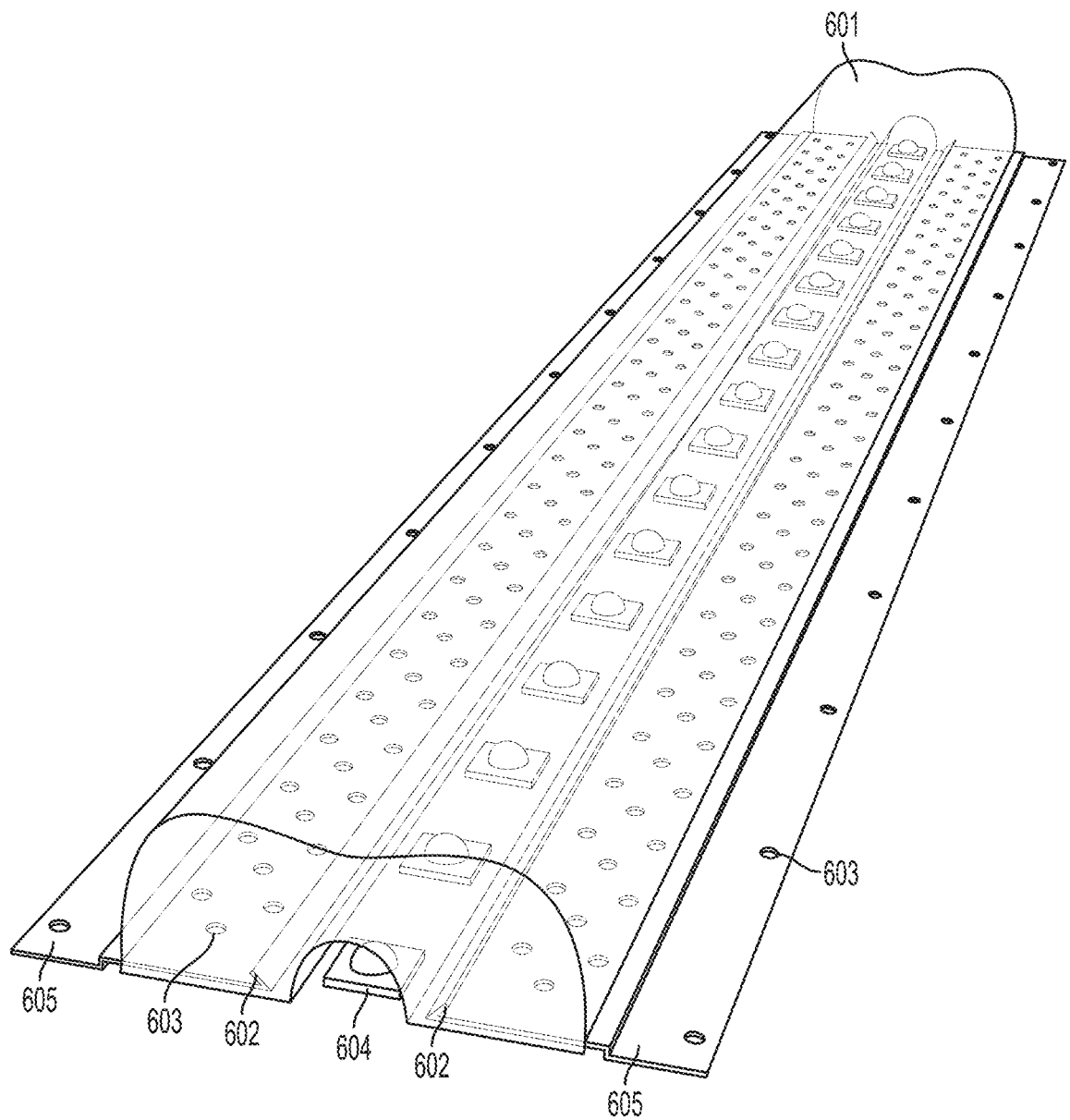
FIG. 8 is a perspective view of an optic formed with two second elements at least partially encapsulated therein.
Figure 9:
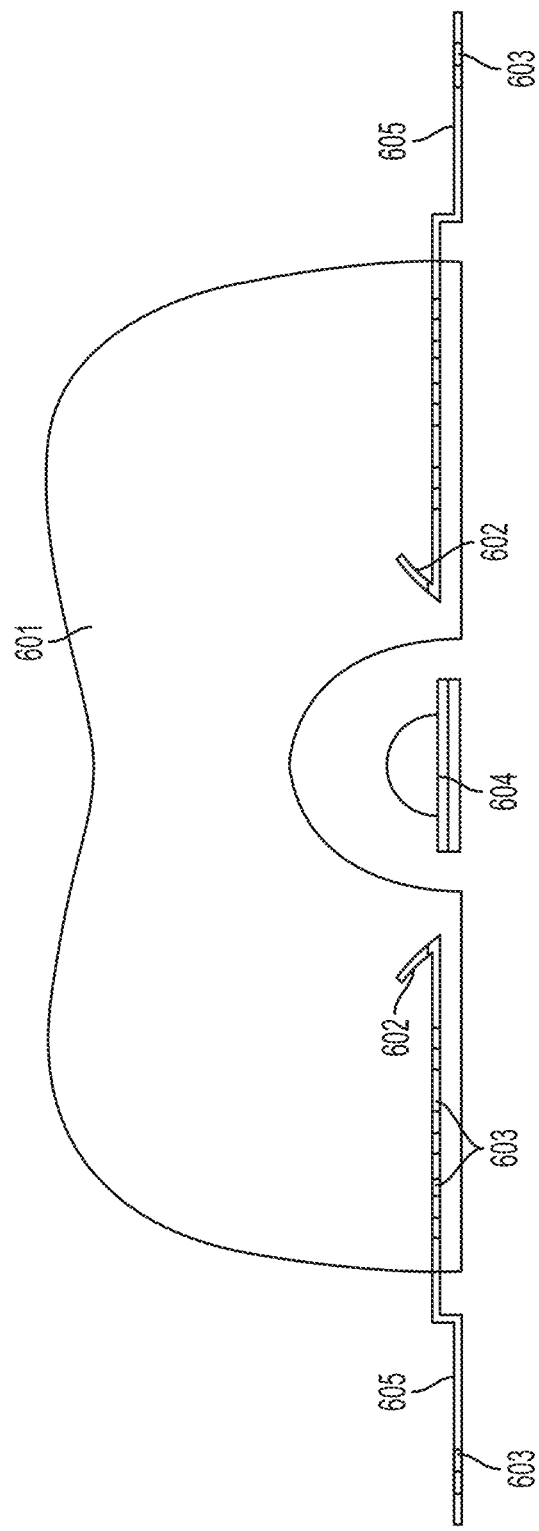
FIG. 9 is a cross-sectional view of the optic of FIG. 8.
Figure 10:
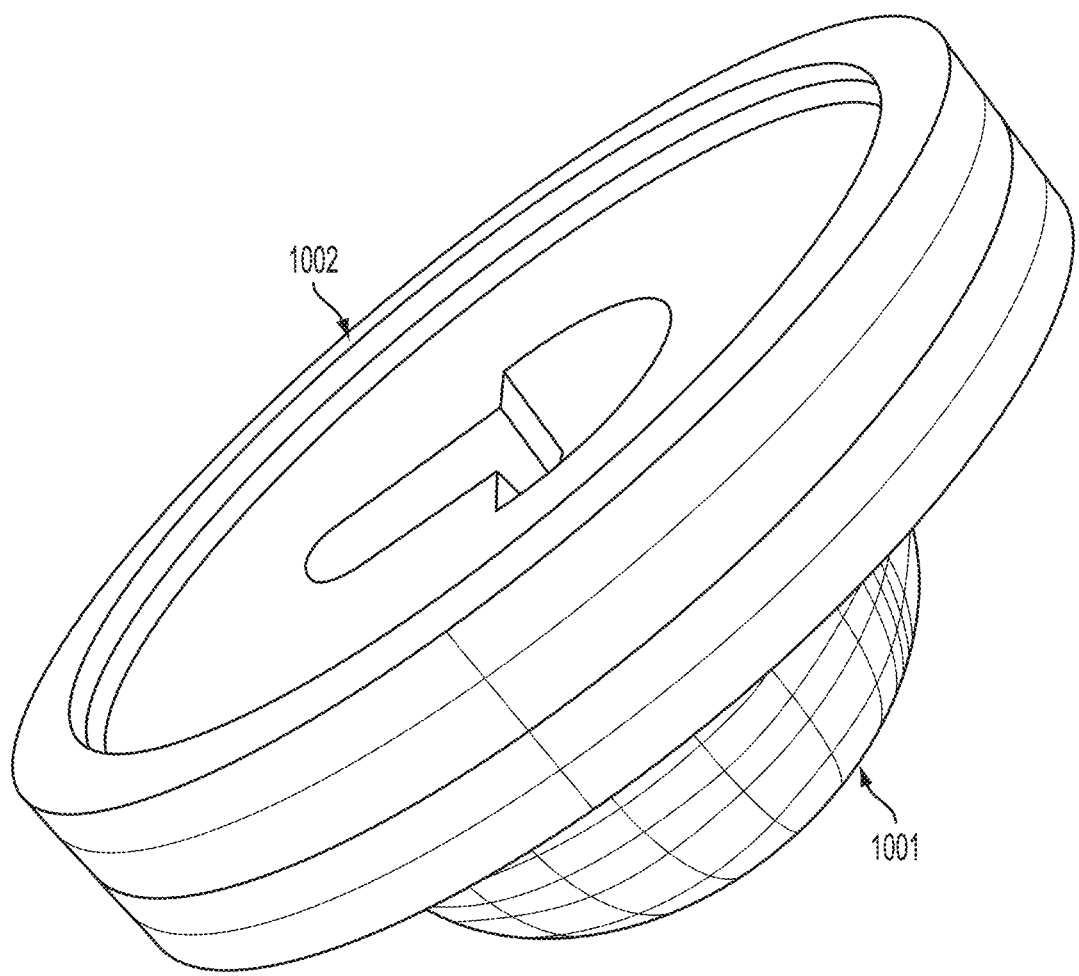
FIG. 10 is a perspective view of a multiple-component discrete optic.

Optic 601 typically may be up to 24 inches wide (i.e., the transverse direction in FIGS. 7 and 9) with a continuous length or any practical length (i.e., the longitudinal direction in FIGS. 6 and 8). Further, modular sizes may be from 1 to 12 inches, 12 to 24 inches, 24 to 48 inches, and 48 inches or longer for continuous run luminaires.

It may also be desirable, in some embodiments, subsequently to attach a cured optic to another structure, such as (but not limited to) a printed circuit board populated with one or more adjacent components 604 such as light sources (the light source may be, for example, an LED). FIGS. 6-9 illustrate embodiments of the optic 601 provided with a mounting flange 605 or flanges that are partially encapsulated in the optic 601 but that include an exposed portion (i.e., see mounting flange 605) that extends from the optic 601. The exposed portion of the mounting flange 605 is provided with apertures 603 to receive mechanical fasteners for attaching the optic 601 to another structure. In the figures, each mounting flange 605 is shown formed integrally with a reflector 602 but such need not be the case. Moreover, in some embodiments, a reflector 602 is provided without a mounting flange 605 and in other embodiments a mounting flange 605 is provided without a reflector 602. Obviously many other types of mountings structures (e.g., mounting brackets, etc.) can be molded directly into the optic 601 and used to attach the optic 601 to another structure. Embodiments are certainly not intended to be limited to the mounting flanges illustrated in the figures.

Methods for Discrete Lenses

Figure 11:
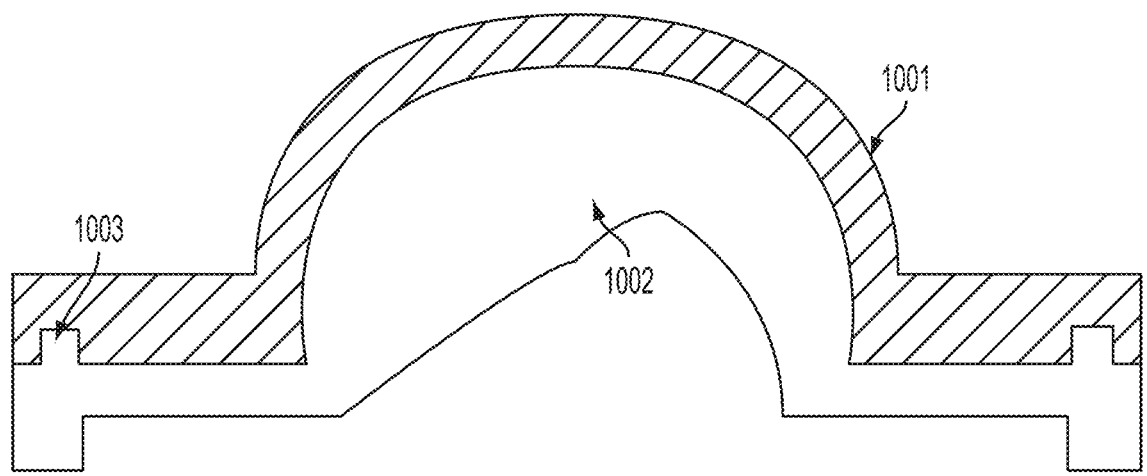
FIG. 11 is a cross-sectional view of the optic of FIG. 10.
Figure 12:
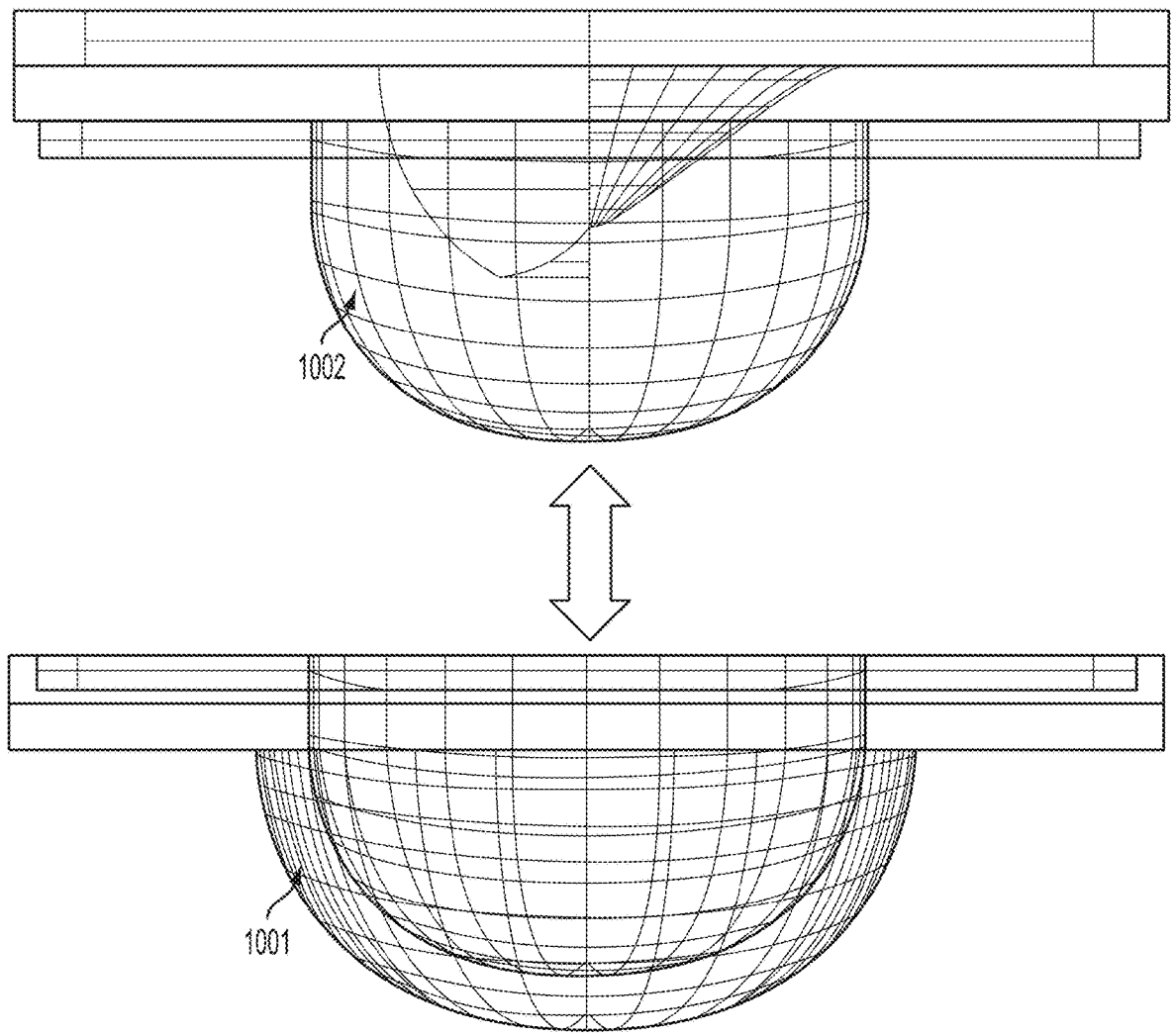
FIG. 12 is an exploded view of a multiple-component discrete optic.
Figure 13:
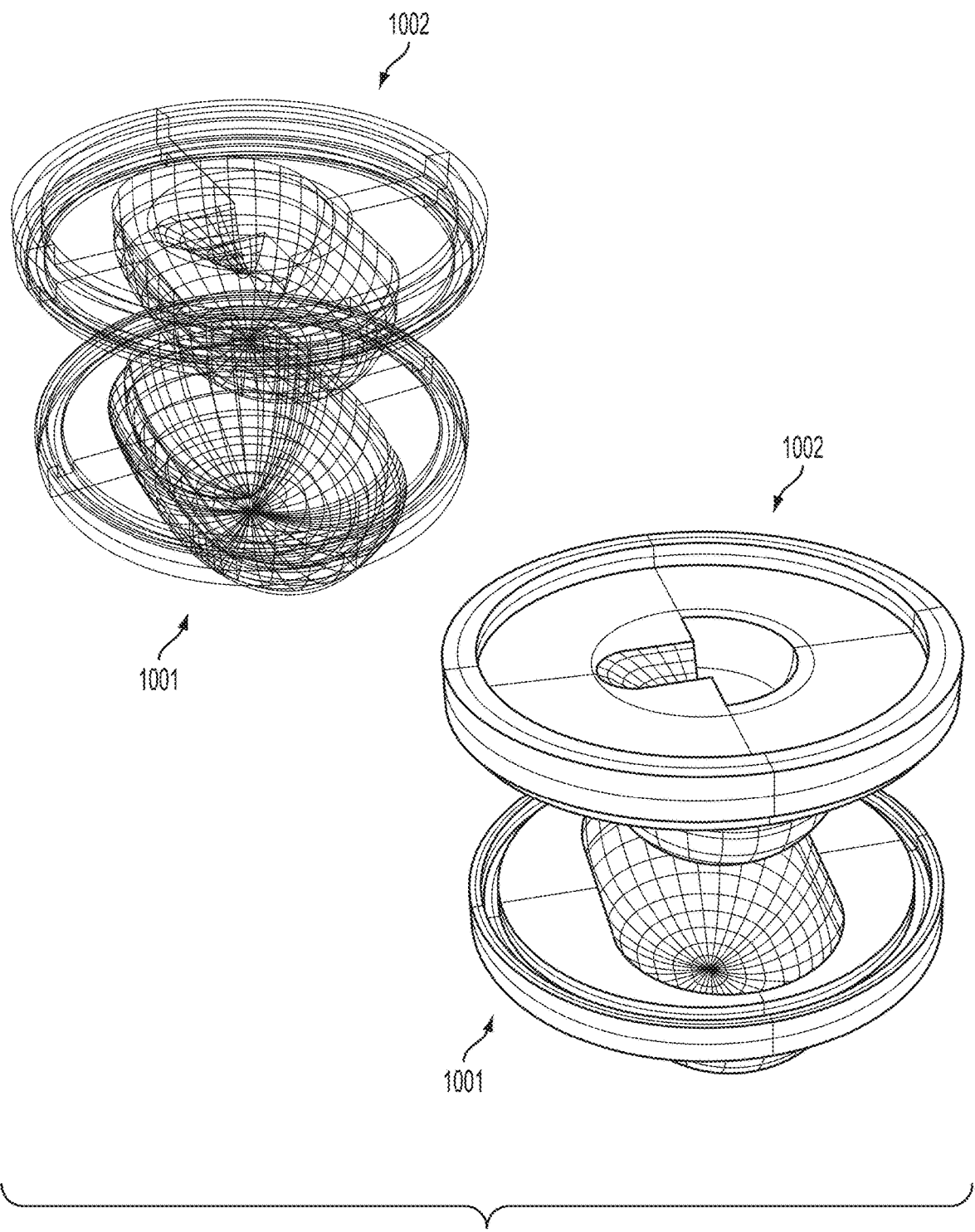
FIG. 13 is a perspective view depicting an exploded wireframe and line drawing views of a multiple-component discrete optic.

Silicone optics need not be formed only as linear optics. Rather, the present disclosure related to silicone or other materials may also be used in forming discrete lenses. It can be difficult to manufacture discrete lenses with the structure needed (e.g., with the necessary thick to thin ratio, etc.) to achieve a desired optical distribution. In some embodiments, silicone may be used to enhance the optical properties of the lens. FIGS. 10-13 illustrate an embodiment of a round lens that has an optic shell of a first material 1001 (e.g., glass, plastic, etc. in the figures). The shell 1001 has a geometry (e.g., consistent thickness) that renders it easy to manufacture but that provides only generic light distribution. A silicone optic 1002 may be used to enhance and customize that distribution. More specifically, silicone may be molded or cast on the outside or underside of the pre-formed optic shell to add shape to the lens so as to achieve the desired light distribution. As shown in FIG. 11, structures or mechanical features such as voids 1003 (e.g., grooves, holes, etc.) may be provided in the flange on the optic shell so that, when the silicone is molded or cast on the shell 1001, it fills the voids 1003 and thus mechanically interlocks the shell and silicone layers together with the first material 1001.

The shell 1001 may be formed of glass and the silicone optic 1002 may be molded on the underside of the glass directly over the light source 604 or internal to the luminaire such that the silicone is not exposed to the outside of the luminaire. In this way, the outer shell of glass creates a clean smooth surface that is hard and resistant to scratching and other normal wear as well as dirt build-up. The internal layer of silicone provides precise and sharp inner optical shapes with no draft (i.e., taper with respect to a parting line) and some slight undercuts to control the optics to a higher level of optical efficiency over solid glass or plastic parts. As shown in FIG. 11, one or more grooves 1003 may be provided for the purpose of ensuring mechanical attachment between shell 1001 and silicone optic 1002 where the silicone fills the grooves to interlock the silicone optic 1002 with the existing optic shell 1001.

Silicone can be molded, cast, or extruded directly onto one or more first materials where the first materials are, for example, optical plastic grade acrylic poly(methyl methacrylate) (PMMA), polycarbonate (PC), or glass. The index of refraction is different for each material. As the materials are bonded, each pair of materials creates an internal surface at the interface of the different materials not visible to an unaided human eye. There is an interstitial interface at the internal surface, and the interstitial interface is continuous between the different materials such that there is no free air between the two materials. The interstitial interface refracts light with fewer losses and, consequently, higher performance than if an air gap exists between materials. The elimination of the air gap between materials ensures that losses are minimized because the elimination of the air gap causes more light to pass through the interstitial interface compared to light reflected in unwanted directions due to reflections created at the interface of a lens and an air gap. The elimination of the air gap yields an increase in performance efficiency of 30% to 50% compared to known reflection losses with air to surface reflections. The performance gains are due to (1) the interstitial interface and (2) the additional fine detail (small-scale features) of the silicone optical structure compared to glass. The size and geometry of glass structure is limited due to the molding temperatures of glass which result in fine details breaking off during the cooling process. Further, glass requires steel tools, which, if built with the fine details seen in the silicone optics herein, will fracture in the molding process due to the high temperature of the molten glass.

The speed of light depends on the material properties of the object through which the light is travelling (i.e., air, water, glass, plastic, etc.) and all materials have an index of refraction (n) to define the speed at which light passes through the respective material. In addition, based on the index of refraction and the associated speed, the angle of incidence (i.e., the angle with respect to the normal direction of the surface of the object through which the light passes) changes as light moves from one material to another (i.e., from air into a lens). In other words, the travel direction of light "bends" as it passes from a first material to a second material. Further, the amount of bending that occurs when the light enters the second material is proportional to the ratio of the indices of refraction of the first and second materials such that less bending will occur if the two materials have similar indices of refraction. Because, as described above, the interstitial interface eliminates any air gap between the silicone and the adjacent component to which it is bonded, the light bending that occurs is easier to control and calculate resulting in increased optical performance. For example, there is only one bending occurrence (lens-to-silicone) whereas a configuration with an air gap would result in two bending occurrences (lens-to-air and air-to-silicone). Furthermore, the materials can be selected to ensure similar indices of refraction to limit the amount of bending to better control and predict resultant light output and maximize efficiency.

Based on the respective indices of refraction, a critical angle can be calculated for the interface between two known materials. When light is incident on a surface of a material, the light can pass entirely through the material (either at the angle of incidence or at a refracted angle), part of the light can pass through the material and part of the light can be reflected at the surface, or, if the angle of incidence equals or is greater than the critical angle, all of the light can be reflected by the material (called total internal reflection or TIR). The critical angle is the minimum threshold angle with respect to the axis normal to the surface of a material at which light incident on the material surface will be totally internally reflected by the material (i.e., will not pass through the material but be entirely reflected by the material). The exact value of the critical angle depends upon the material used for the optic and its index of refraction. Different combinations of materials have different critical angles.

Total internal reflection (TIR) limits the degree to which light can be refracted or bent by an optic and thus limits the angular range at which light can exit an optic. The hybrid optics described herein can be used to bend light more often and collectively to a greater extent than traditional optics to achieve light emission from the optic within a wider angular range. More specifically and as described above, the use of the interstitial interface allows two materials to be layered (without an air gap in between) such that light can be precisely controlled and provides three opportunities to bend the light including (1) geometric features at the entry surface of the first material, (2) the interstitial interface between the first material and the second material, and (3) geometric features at the exit surface of the second material. The collective angle at which the light is refracted or bent by these three surfaces can exceed the critical angle while avoiding TIR. Of course, additional layers can be added to the optic, which would increase the number of opportunities for bending of light. Accordingly, because of the interstitial interface (or interstitial interfaces if the lens has more than two layers) and depending on the geometric features and materials chosen for the lens, lenses can be built that are capable of refracting light from any angle from 0° (parallel to the normal direction) to approximately 90° (perpendicular to the normal direction) including angles greater than the critical angle.

Place Bonding Methods

Co-molded optics can be made from any material suitable for optical transfer or reflection including but not limited to plastic, glass, silicone, metal, or film and can be bonded to a second material using a bonding substrate material to permanently adhere the optic structure to a second optical structure (constructed from the second material) to enhance optical properties.

Figure 16:
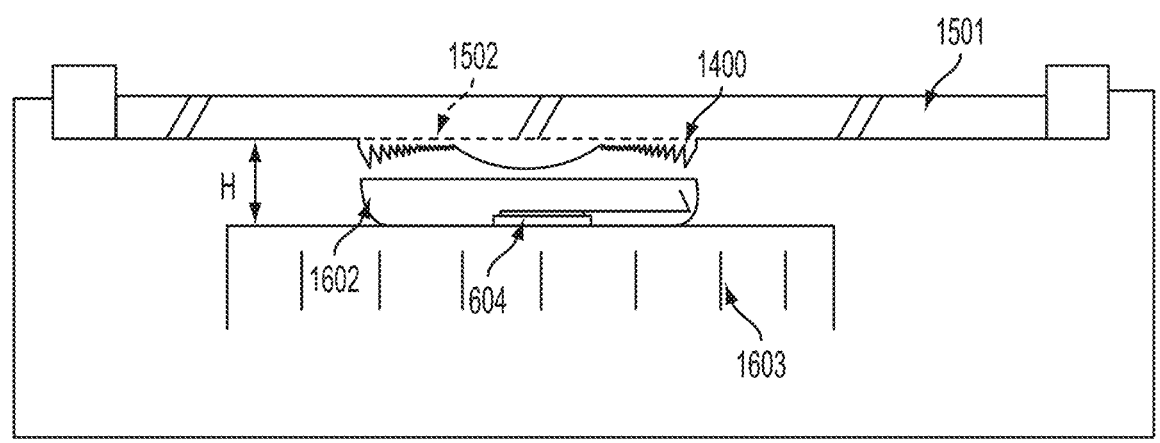
FIG. 16 is a schematic view of a light fixture assembly including an optic assembly.
Figure 17A:
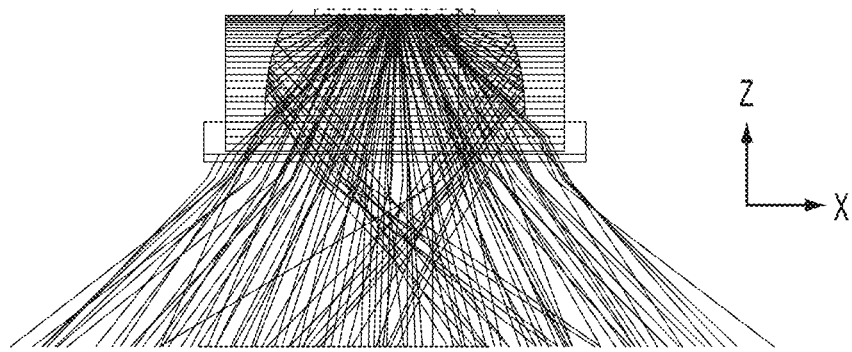
FIGS. 17A, 17B, and 17C depict front, side, and underneath views of a light pattern produced from an optic.
Figure 17B:
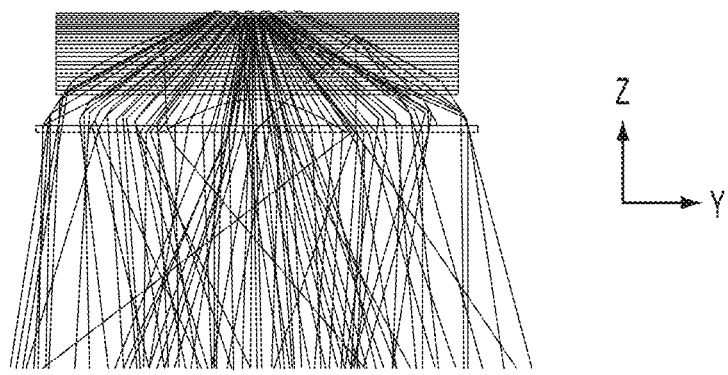
Figure 17C:
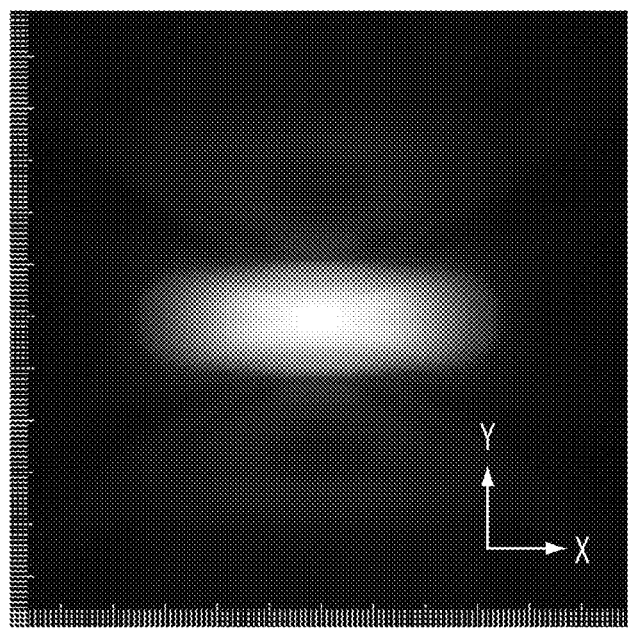

One example of an assembled light fixture including a place bonded silicone optic 1400 is shown in FIG. 16. The light source 604 is attached to a heat sink 1603 with an adjacent reflector 1602 such that light is directed into the pre-molded or pre-cast silicone optic 1400 before finally passing through the second material 1501. The efficiency of the pre-molded or pre-cast silicone optic 1400 combined with reflector 1602 allows dimension H to be approximately 1 inch. Conventional light fixture arrangements often require approximately 6 inches for dimension H. Accordingly, the silicone optics described herein may help reduce weight, physical dimensions, and inefficiencies associated with traditional lighting fixtures.

A method of "place bonding" where pre-molded or pre-cast silicone optics are arranged adjacent to other optical or mechanical materials such as directly onto a second material (i.e., a sheet of glass) typically used on luminaires as a lens or reflector cover to keep the luminaire interior sealed (i.e., to ensure that the interior of the luminaire is free of contaminants such as dirt and rainwater). It is possible to directly mold silicone optics onto glass using a standard injection molding machine, but the costs associated with standard over mold tooling are high and such methods are time consuming because a tool must be designed and manufactured specifically for each application. From a business perspective, these methods are undesirable because it is difficult to amortize or recoup the cost of the tool during typical short life product runs. Accordingly, one solution is to employ a method using a "place bonding" template die that is placed over the second material. Pre-molded or pre-cast optics can be placed into the die openings by hand or using pick and place robotic system. To seal the components, a heat cured silicone optical material may be used to bond the pre-cast/pre-molded optic 1400 to the second material 1501. The heat cured silicone optical material may be a room temperature vulcanizing (RTV) sealant or a liquid silicone rubber (LSR). One example of a pre-molded or pre-cast silicone optic 1400 is shown in FIGS. 14A-17. Once the optic 1400 has been placed with the RTV or LSR bonding material 1502, the complete part 1500 will be inserted in a thermal curing oven to cure the bonding material 1502 (see FIG. 15). A lehr (i.e., a continuous furnace that is a long oven or kiln with a conveyor belt) could also be used to cure the bonding material 1502.

Figure 14A:
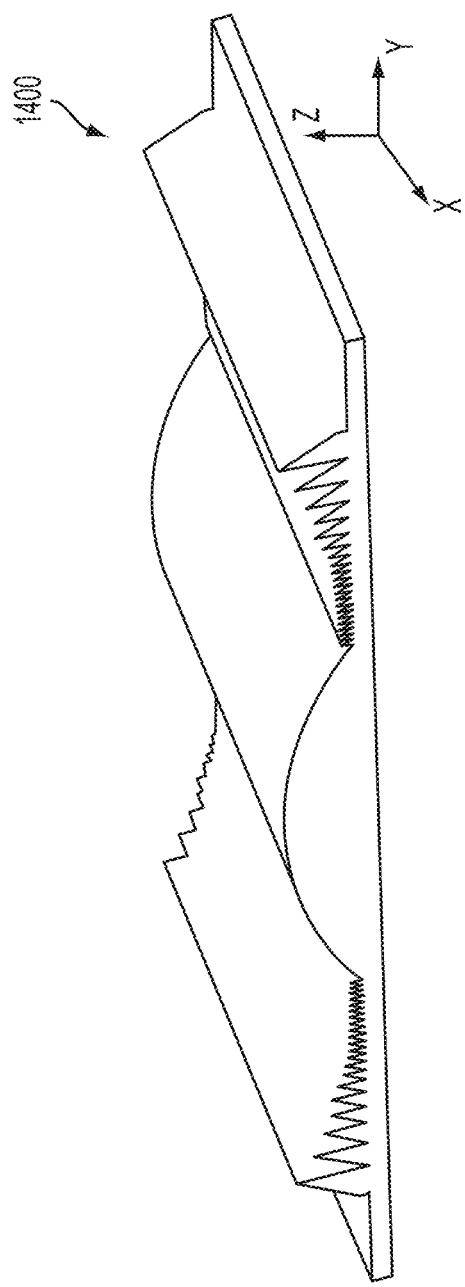
FIGS. 14A and 14B are perspective and cross-sectional views, respectively, of an optic.
Figure 14B:
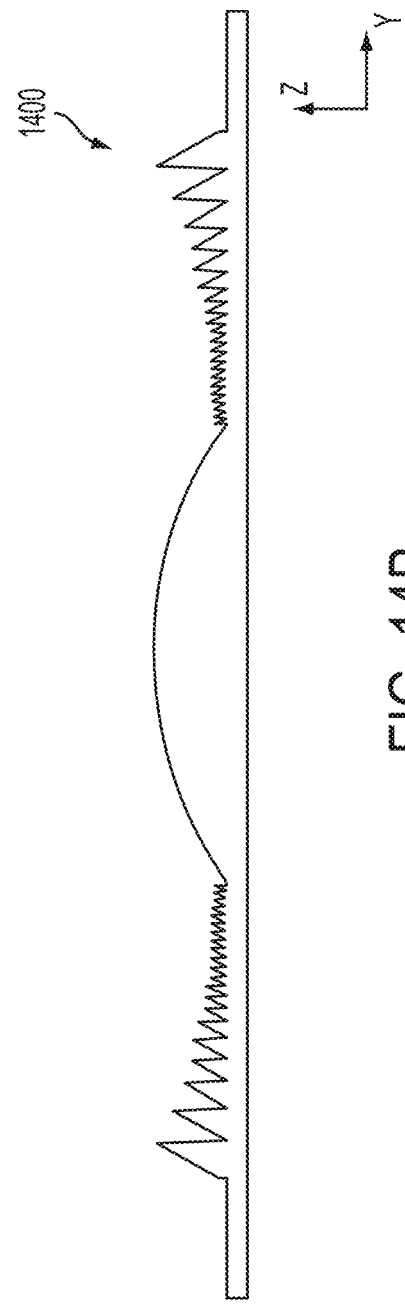

Optic 1400 typically may be up to 24 inches wide (i.e., in the Y-direction in FIGS. 14A and 14B) with a continuous length or any practical length (i.e., in the X-direction in FIGS. 14A and 14B). Further, modular sizes from 1 to 12 inches, 12 to 24 inches, 24 to 48 inches, and 48 inches or longer for continuous run luminaires.

The foregoing is provided for purposes of illustrating, explaining, and describing embodiments of the present invention. Further modifications and adaptations to these embodiments will be apparent to those skilled in the art and may be made without departing from the scope or spirit of the invention. Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments are possible. Accordingly, the present invention is not limited to the embodiments described above or depicted in the drawings, and various embodiments and modifications can be made without departing from the scope of the invention.

What is claimed is:

1. A method for manufacturing an optical component, the method comprising:
   mixing two precursors of silicone to form a liquid silicone mixture;
   moving the liquid silicone mixture from an extrusion machine into an optic forming device while cooling the liquid silicone mixture to maintain the liquid silicone mixture in a liquid form;
   extruding the liquid silicone mixture through a die in the optic forming device, while heating the liquid silicone mixture, to form a continuous length of cured silicone; and
   cutting the continuous length of the cured silicone at a desired length to form the optical component.

2. The method of claim 1, further comprising:
   co-extruding one or more additional elements with the liquid silicone mixture such that the one or more additional elements are at least partially encapsulated by the cured silicone.

3. The method of claim 2, wherein
   the one or more additional elements comprise one or more brackets, a first lens, and a second lens.

4. The method of claim 3, wherein
   an interface between the cured silicone and the first lens comprises an interface that contains no free air between the cured silicone and the first lens.

5. The method of claim 2, wherein
at least one of the one or more additional elements comprises one or more structures to interlock the at least one of the one or more additional elements to the cured silicone.

6. A method of manufacturing an, comprising:
mixing two precursors of silicone to form a silicone mixture;
opening a first gate at an upstream end of an optic forming device;
moving the silicone mixture from an extrusion machine into the optic forming device while cooling the silicone mixture;
filling a mold within the optic forming device with the silicone mixture;
closing the first gate; and
heating the silicone mixture in the mold to form an at least partially cured optical component portion.

7. The method of claim 6, further comprising:
separating a first half of the mold from a second half of the mold to access the at least partially cured optical component portion.

8. The method of claim 6, further comprising:
opening a second gate at a downstream end of the mold;
forcing a portion of the at least partially cured optical component portion through the second gate leaving a vacant portion of the mold;
charging the vacant portion of the mold with additional silicone mixture; and
heating the additional silicone mixture in the mold to at least partially cure an additional optical component portion.

9. The method of claim 8, wherein
the portion of the at least partially cured optical component portion is forced through the second gate by fluid pressure.

10. The method of claim 6, further comprising:
arranging one or more additional elements in the mold such that the one or more additional elements are at least partially encapsulated by the silicone mixture.

11. The method of claim 10, wherein
the one or more additional elements comprise a reflector.

12. The method of claim 10, wherein:
the one or more additional elements comprise a lens; and
an interface between the silicone mixture and the lens comprises an interface that contains no free air between the silicone mixture and the lens.

13. The method of claim 10, wherein
at least one of the one or more additional elements comprises one or more structures to interlock the at least one of the one or more additional elements to the at least partially cured optical component portion.

14. The method of claim 13, wherein
the one or more structures comprise apertures or grooves.

15. The method of claim 6, wherein
the at least partially cured optical component portion comprises one or more recessed areas.

16. The method of claim 6, further comprising:
attaching the at least partially cured optical component portion to a structure.

17. The method of claim 16, wherein
the structure comprises a printed circuit board to which one or more light sources are attached.

* * * * *